(12) United States Patent
Jeon et al.

(10) Patent No.: US 7,173,676 B2
(45) Date of Patent: Feb. 6, 2007

(54) LCD WITH PIXELS CONNECTED TO MULTIPLE GATE LINES

(75) Inventors: Jin Jeon, Anyang-si (KR); Hyung-Guel Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/840,304

(22) Filed: May 6, 2004

(65) Prior Publication Data

US 2005/0001805 A1 Jan. 6, 2005

(30) Foreign Application Priority Data

May 6, 2003 (KR) ...................... 10-2003-0028650

(51) Int. Cl.
*G02F 1/136* (2006.01)
(52) U.S. Cl. ....................................................... 349/48
(58) Field of Classification Search ................ 349/144, 349/48
See application file for complete search history.

(56) References Cited

U.S. PATENT DOCUMENTS

| | | | | |
|---|---|---|---|---|
| 5,903,249 A | * | 5/1999 | Koyama et al. | 345/92 |
| 6,404,466 B1 | * | 6/2002 | Miyahara | 349/48 |
| 6,486,930 B1 | * | 11/2002 | Kwon | 349/48 |
| 6,850,305 B2 | * | 2/2005 | Hsieh et al. | 349/144 |
| 2002/0149318 A1 | * | 10/2002 | Jeon et al. | 315/169.1 |
| 2003/0043104 A1 | * | 3/2003 | Lee et al. | 345/92 |
| 2004/0239608 A1 | * | 12/2004 | Chung | 345/100 |

FOREIGN PATENT DOCUMENTS

| | | |
|---|---|---|
| JP | 05 046123 | 2/1993 |
| JP | 07 199154 | 8/1995 |
| JP | 2000-347628 | 12/2000 |

* cited by examiner

*Primary Examiner*—Andrew Schechter
*Assistant Examiner*—Phu Vu
(74) *Attorney, Agent, or Firm*—Cantor Colburn LLP

(57) ABSTRACT

A display device includes a display panel, first and second gate drivers and a data driver. The display panel includes pixel regions respectively having first, second and third pixels. The first pixel is coupled to first, second gate lines and a data line. The second gate line is adjacent to the first gate line. The second pixel is coupled to the first gate line and a first data line. The third pixel is coupled to the first gate line and a second data line. The first gate driver provides the first gate line with a first gate driving signal, and the second gate driver provides the second gate line with a second gate driving signal. The data driver provides first and second data lines with image signal. The display quality of the display device may be enhanced and the number of the data lines may be reduced.

10 Claims, 8 Drawing Sheets

LCD WITH PIXELS CONNECTED TO MULTIPLE GATE LINES

CROSS-REFERENCE TO RELATED APPLICATIONS

This application claims priority upon Korean Patent Application No. 2003-28650 filed on May 6, 2003, the contents of which are herein incorporated by reference in its entirety.

BACKGROUND OF THE INVENTION

1. Field of the Invention

The present invention relates to a display device, and more specifically to a display device in which a display quality is enhanced and a number of data lines is reduced.

2. Description of the Related Art

A liquid crystal display (LCD) device includes a liquid crystal display panel for displaying an image. The liquid crystal display panel includes a display region, a first peripheral region, a second peripheral region and a third peripheral region.

The first peripheral region includes a plurality of gate lines extended in a first direction and a plurality of data lines extended in a second direction perpendicular to the first direction. A thin film transistor (TFT) is connected to a gate line and a data line, respectively.

The number of the gate lines and the number of the data lines increase according as the area of the liquid crystal display panel increases. The liquid crystal display device employs a structure in which a first gate driver and a second gate driver is disposed in the first and second peripheral regions, respectively according as the number of the gate lines increases.

The first gate driver sequentially outputs a plurality of first gate driving signals to odd numbered gate lines, and the second gate driver sequentially outputs a plurality of second gate driving signals to even numbered gate lines.

A delay of the gate driving signals output to the gate lines may be prevented because the first and second gate drivers are disposed in the first and second peripheral regions, respectively.

A data driver chip for providing the data lines with an image signal is mounted on the third peripheral region. The data lines are connected to the data driver chip. According as the number of the data lines increases, a load of the data driver chip increase and the image signal is delayed to be output to the data lines. The delay phenomenon of the signals may deteriorate the display quality of the liquid crystal display device.

SUMMARY OF THE INVENTION

Accordingly, the present invention is provided to substantially obviate one or more problems due to limitations and disadvantages of the related art.

It is a feature of the present invention to provide a display device of which a display quality is enhanced.

In one exemplary embodiment, a display device includes a display panel, a first gate driver, a second gate driver and a data driver. The display panel includes a plurality of pixel regions respectively having first, second and third pixels. The first pixel is coupled to a first gate line, a second gate line and a data line. The second gate line is adjacent to the first gate line. The second pixel is coupled to the first gate line and a first data line. The third pixel is coupled to the first gate line and a second data line adjacent to the first data line. The first gate driver is configured to provide the first gate line with a first gate driving signal, and the second gate driver is configured to provide the second gate line with a second gate driving signal. The data driver is configured to provide the first and second data lines with an image signal.

According to the display device of the present invention, the display panel includes a plurality of pixel regions, and each of the pixel regions includes first, second and third pixels corresponding respectively to R, G and B color filters. In addition, the first and second pixels are commonly connected to a data line. Thus, the display quality of the display device may be enhanced and the number of the data lines may be reduced.

BRIEF DESCRIPTION OF THE DRAWINGS

The above and other features and advantages of the present invention will become more apparent by describing in detail exemplary embodiments thereof with reference to the accompanying drawings, in which.

DESCRIPTION OF EMBODIMENTS

Detailed illustrative embodiments of the present invention are disclosed herein. However, specific structural and functional details disclosed herein are merely representative for purposes of describing exemplary embodiments of the present invention. This invention may, however, be embodied in many alternate forms and should not be construed as limited to the embodiments set forth herein.

Figure 1:
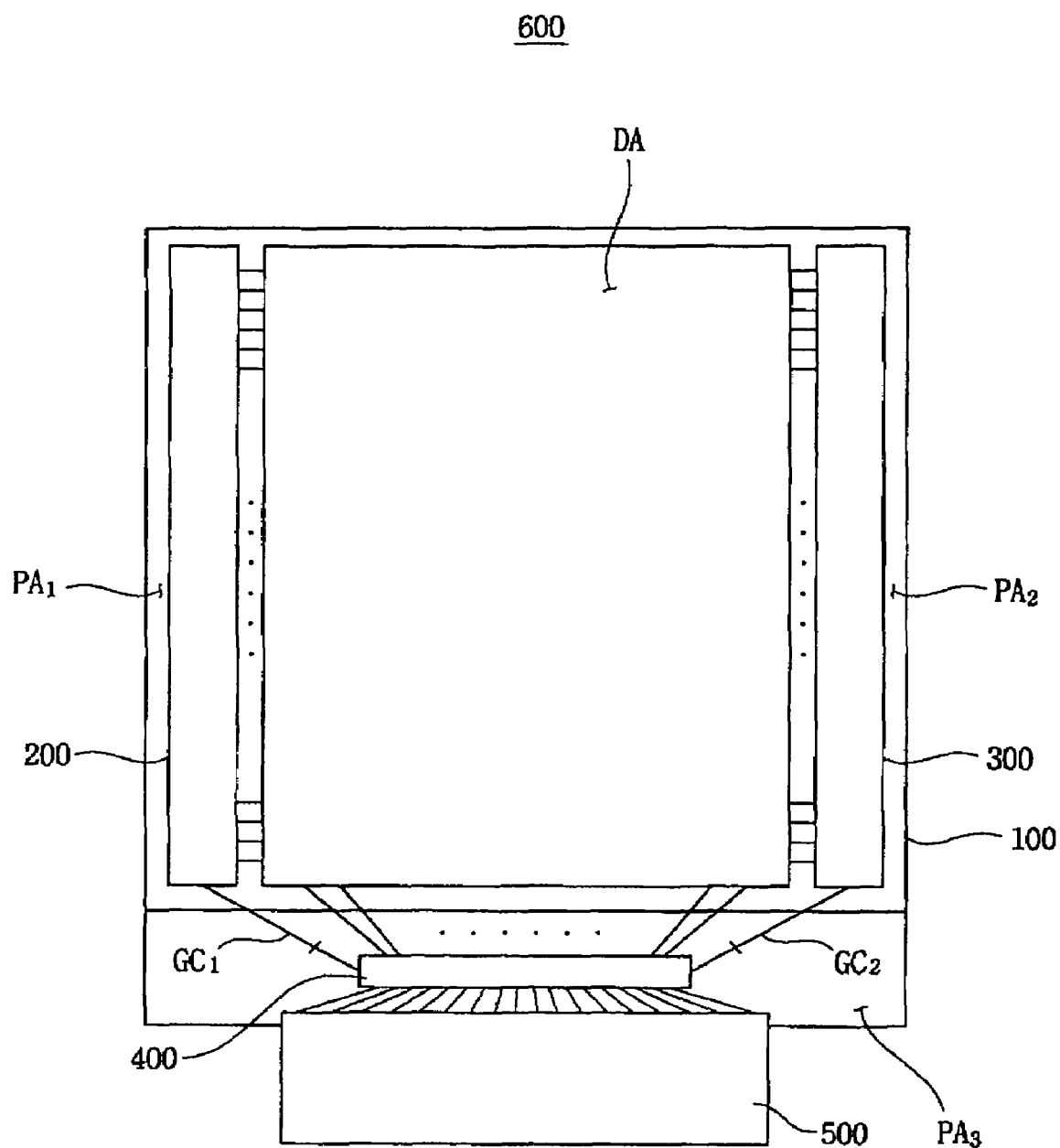
FIG. 1 is a schematic view showing a liquid crystal display device according to one exemplary embodiment.

FIG. 1 is a schematic view showing a liquid crystal display device according to one exemplary embodiment.

Referring to FIG. 1, the liquid crystal display device 600 includes a liquid crystal display panel 100. The liquid crystal display panel 100 includes a display region (DA), a first peripheral region (PA1), a second peripheral region (PA2) and a third peripheral region (PA3). The first, second and third peripheral regions (PA1, PA2, PA3) are disposed peripheral to the display region (DA).

A first gate driver 200 is integrated in the first peripheral region (PA1) and a second gate driver 300 is integrated in the second peripheral region (PA2). An integrated chip 400 is mounted on the third peripheral region (PA3).

A flexible printed circuit board (FPC) 500 is attached to the third peripheral region (PA3). The FPC 500 receives external signals output from external devices and provides the external signals to the integrated chip 400. The integrated chip 400 converts the external signals into first and second control signals (GC1, GC2) for controlling the first and second gate drivers 200 and 300, respectively. The first gate driver 200 provides a plurality of first gate driving signals to the display region (DA) based on the first control signal (GC1). The second gate driver 300 provides a plurality of second gate driving signals to the display region (DA) based on the second control signal (GC2). The integrated chip 400 provides an image signal to the display region (DA).

Figure 2:
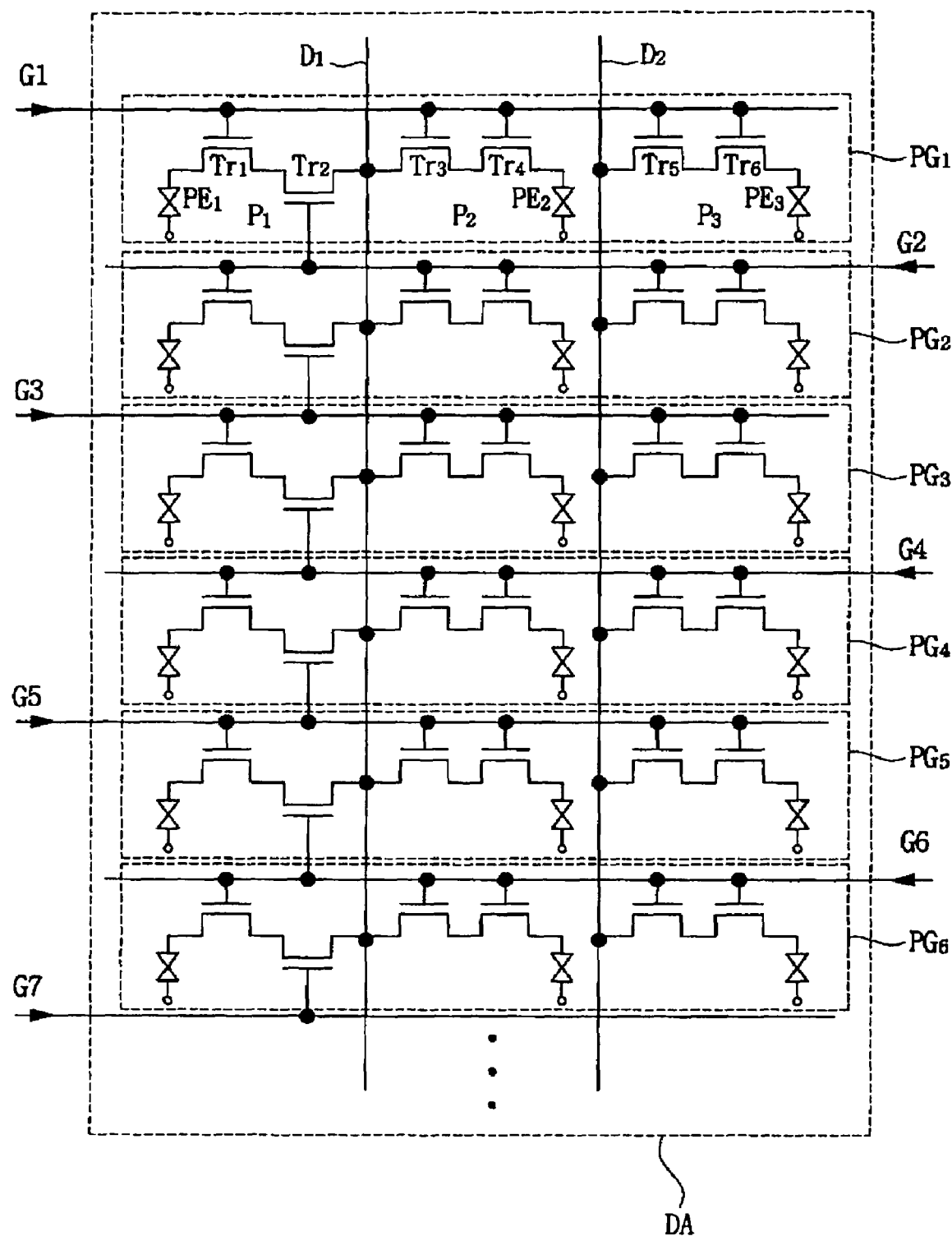
FIG. 2 is a schematic view showing a display region of FIG. 1.
Figure 3:
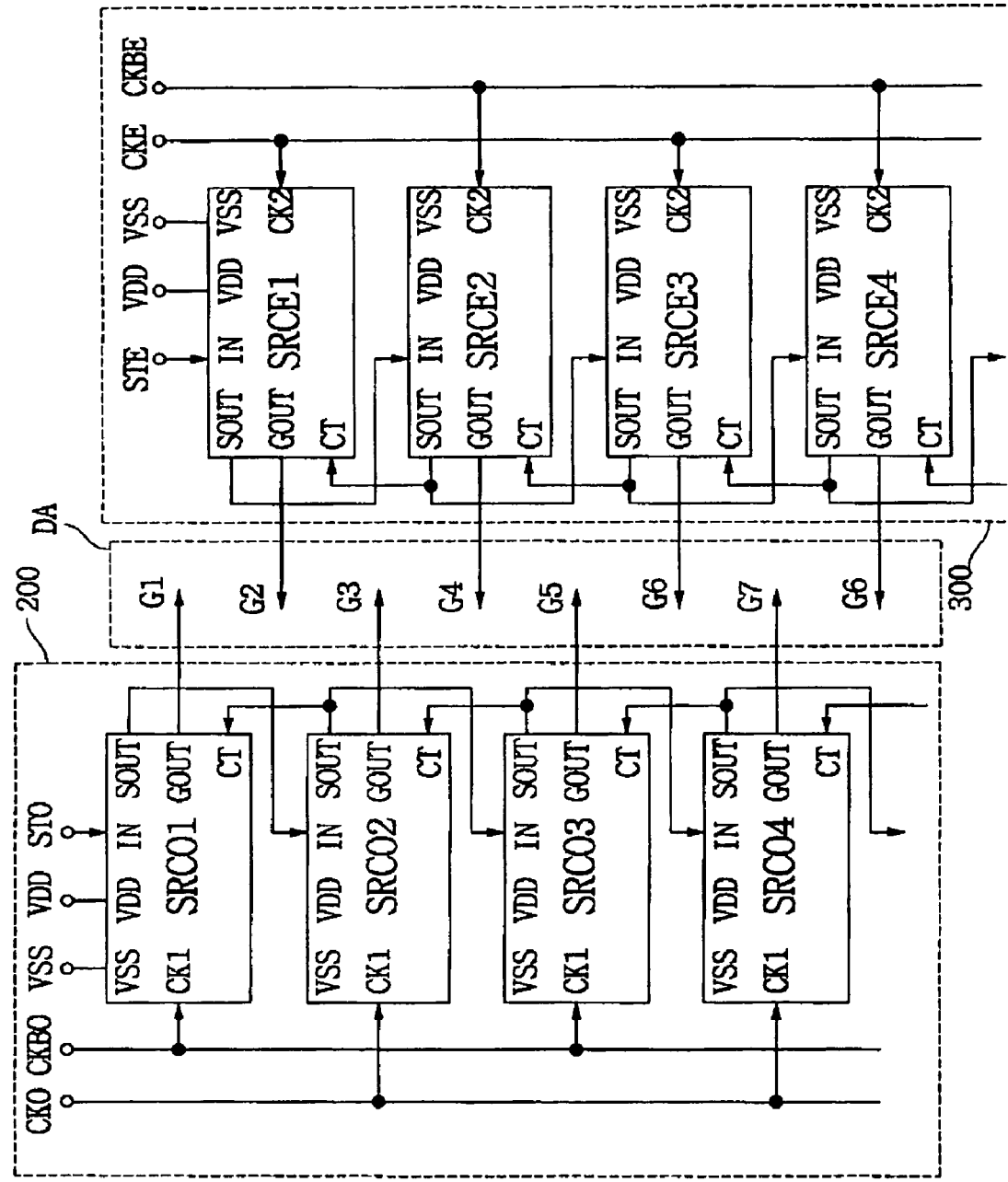
FIG. 3 is a schematic view showing first and second gate drivers of FIG. 1.
Figure 4:
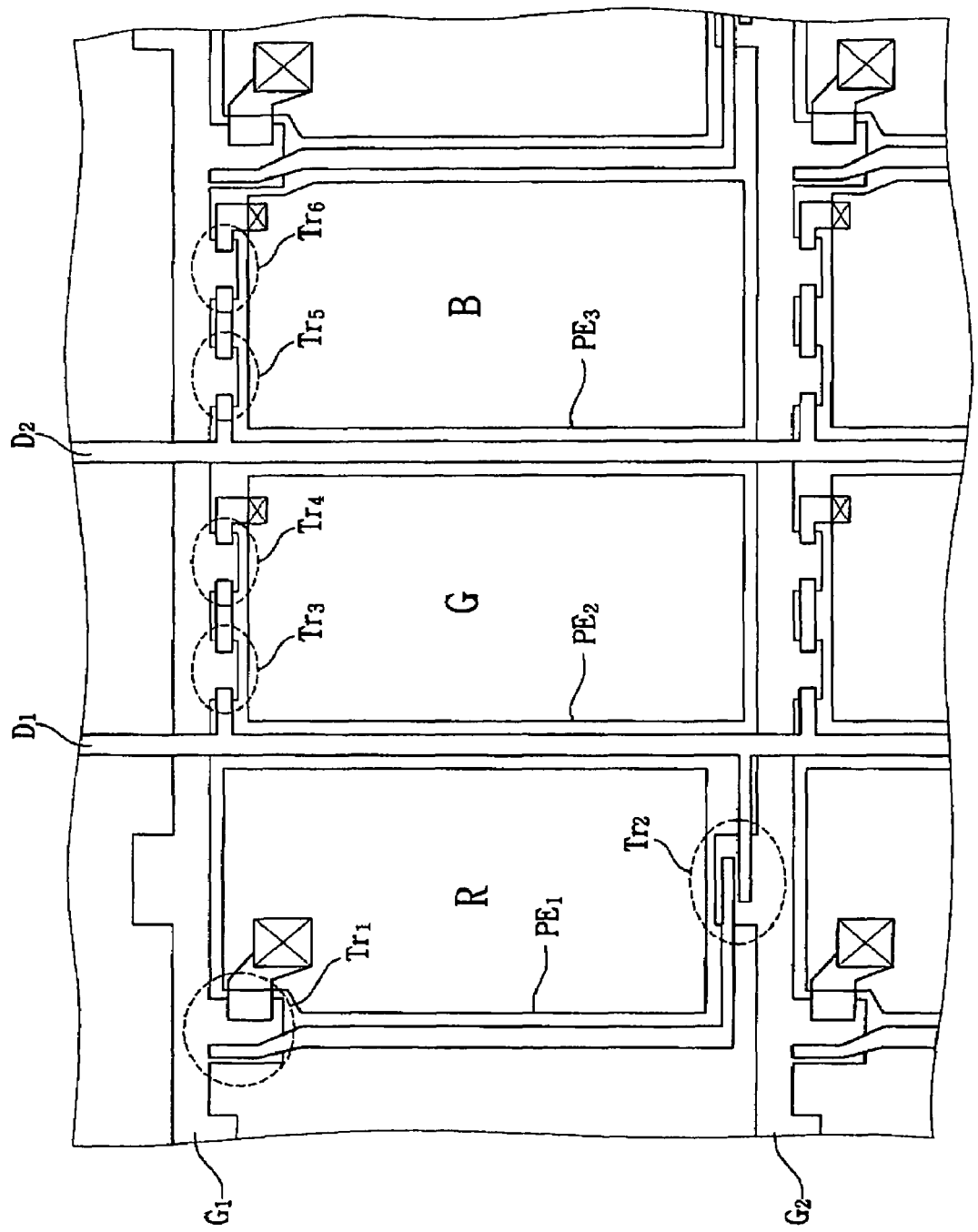
FIG. 4 is a layout showing the display region of FIG. 2.

FIG. 2 is a schematic view showing a display region of FIG. 1, FIG. 3 is a schematic view showing first and second gate drivers of FIG. 1, and FIG. 4 is a layout showing the display region of FIG. 2.

A plurality of pixel regions (PG1, PG2, PG3, PG4, PG5, PG6, . . . ) is formed on the display region. Since each of the pixel regions (PG1, PG2, PG3, PG4, PG5, PG6, . . . ) has a same structure, hereinafter, a first pixel region (PG1) is described and the other pixel regions are not described.

Referring to FIGS. 2 and 4, the first pixel region (PG1) includes first and second gate lines (G1, G2), first and second data lines (D1, D2), first, second and third pixels (P1, P2, P3). The first gate line (G1) is extended in a first direction (A1). The first data line (D1) is extended in a second direction (A2) substantially perpendicular to the first direction (A1). The second data line (D2) is insulated from the first data line (D1) and is extended in the second direction (A2).

The first, second and third pixels (P1, P2, P3) correspond to an R (red) color filter, a G (green) color filter and a B (blue) color filter, respectively. The first pixel (P1) is connected to the first data line (D1), the first and second gate lines (G1, G2). The second pixel (P2) is connected to the first gate line (G1) and the first data line (D1). The third pixel (P3) is connected to the first gate line (G1) and the second data line (D2).

The first pixel (P1) includes a first thin film transistor (TFT) (Tr1), a second TFT (Tr2) and a first pixel electrode (PE1). A gate electrode of the second TFT (Tr2) is connected to the second gate line (G2), a source electrode of the second TFT (Tr2) is connected to the first data line (D1), and a drain electrode of the second TFT (Tr2) is connected to first TFT (Tr1). A gate electrode of the first TFT (Tr1) is connected to the first gate line (G1), a source electrode of the first TFT (Tr1) is connected to the drain electrode of the second TFT (Tr2), and a drain electrode of the first TFT (Tr1) is connected to first pixel electrode (PE1).

The second pixel (P2) includes a third TFT (Tr3), a fourth TFT (Tr4) and a second pixel electrode (PE2). A gate electrode of the third TFT (Tr3) is connected to the first gate line (G1), a source electrode of the third TFT (Tr3) is connected to the first data line (D1), and a drain electrode of the third TFT (Tr3) is connected to fourth TFT (Tr4). A gate electrode of the fourth TFT (Tr4) is connected to the first gate line (G1), a source electrode of the fourth TFT (Tr4) is connected to the drain electrode of the third TFT (Tr3), and a drain electrode of the fourth TFT (Tr4) is connected to second pixel electrode (PE2).

The third pixel (P3) includes a fifth TFT (Tr5), a sixth TFT (Tr6) and a third pixel electrode (PE3). A gate electrode of the fifth TFT (Tr5) is connected to the first gate line (G1), a source electrode of the fifth TFT (Tr5) is connected to the second data line (D2), and a drain electrode of the fifth TFT (Tr5) is connected to sixth TFT (Tr6). A gate electrode of the sixth TFT (Tr6) is connected to the first gate line (G1), a source electrode of the sixth TFT (Tr6) is connected to the drain electrode of the fifth TFT (Tr5), and a drain electrode of the sixth TFT (Tr6) is connected to third pixel electrode (PE3).

Thus, the first pixel region PG1 is repeatedly formed in the display region (DA), and a plurality of data lines and a plurality of gate lines are disposed in the display region (DA). In a conventional liquid crystal display panel, a data line is connected to each of the first, second and third pixels (P1, P2, P3) of the first pixel (PG1). However, as shown in FIG. 2, the first data line (D1) is commonly connected to the first and second pixels (P1, P2). Thus, the first pixel region (PG1) has two data lines, and the number of the data lines of the display region (DA) may be reduced.

Referring to FIG. 3, the first gate driver 200 is connected to odd numbered gate lines (G1, G3, G5, G7, . . . ) and provides a plurality of first gate driving signals to the odd numbered gate lines (G1, G3, G5, G7, . . . ). The second gate driver 300 is connected to even numbered gate lines (G2, G4, G6, . . . ) and provides a plurality of second gate driving signals to the even numbered gate lines (G2, G4, G6, . . . ).

The first gate driver 200 includes a first shift register. The first shift register has a plurality of stages (SRCO1, SRCO2, SRCO3, SRCO4, . . . ) that is cascaded-connected each other. Each of the stages includes an input terminal (IN), a first output terminal (GOUT), a second output terminal (SOUT), a control terminal (CT), a first clock terminal (CK1), a first power terminal (VDD) and a second power terminal (VSS).

The first output terminal (GOUT) is connected to the odd numbered gate lines (G1, G3, G5, G7, . . . ) and sequentially provides the first gate driving signals to the odd numbered gate lines (G1, G3, G5, G7, . . . ). The second output terminal (SOUT) is a control terminal (CT) of a previous stage and an input terminal (IN) of a next stage, and outputs a first stage driving signal. The first stage driving signal has a substantially same phase as the first gate driving signal. A first start signal (STO) is provided to the input terminal (IN) of a first stage (SRCO1).

The first clock terminal (CK1) receives a first clock signal (CKO) or a second clock signal (CKBO) having a phase different from the first clock signal (CKO). For example, the second clock signal (CKBO) has an inverted phase with respect to the first clock signal (CKO). The first clock signal (CKO) is provided to even numbered stages (SRCO2, SRCO4, . . . ) and the second clock signal (CKBO) is provided to odd numbered stages (SRCO1, SRCO3, . . . ). The first power terminal (VDD) receives a first power voltage (VDD) and the second power terminal (VSS) is connected to a ground.

The second gate driver 300 includes a second shift register. The second shift register has a plurality of stages (SRCE1, SRCE2, SRCE3, SRCE4, . . . ) that is cascaded-connected each other. Each of the stages includes an input terminal (IN), a first output terminal (GOUT), a second output terminal (SOUT), a control terminal (CT), a second clock terminal (CK1), a first power terminal (VDD) and a second power terminal (VSS).

The first output terminal (GOUT) is connected to the even numbered gate lines (G2, G4, G6, . . . ) and sequentially provides the second gate driving signals to the even numbered gate lines (G2, G4, G6, . . . ). The second output terminal (SOUT) is a control terminal (CT) of a previous stage and an input terminal (IN) of a next stage, and outputs a second stage driving signal. The second stage driving signal has a substantially same phase as the second gate driving signal. A second start signal (STE) is provided to the input terminal (IN) of a first stage (SRCE1).

The second clock terminal (CK2) receives a third clock signal (CKE) or a fourth clock signal (CKBE) having a phase different from the third clock signal (CKE). For example, the fourth clock signal (CKBE) has an inverted phase with respect to the third clock signal (CKE). The third clock signal (CKE) is provided to odd numbered stages (SRCE1, SRCE3, . . . ) and the fourth clock signal (CKBE) is provided to even numbered stages (SRCE2, SRCE4, . . . ). The first power terminal (VDD) receives the first power voltage (VDD) and the second power terminal (VSS) is connected to the ground.

Figure 5:
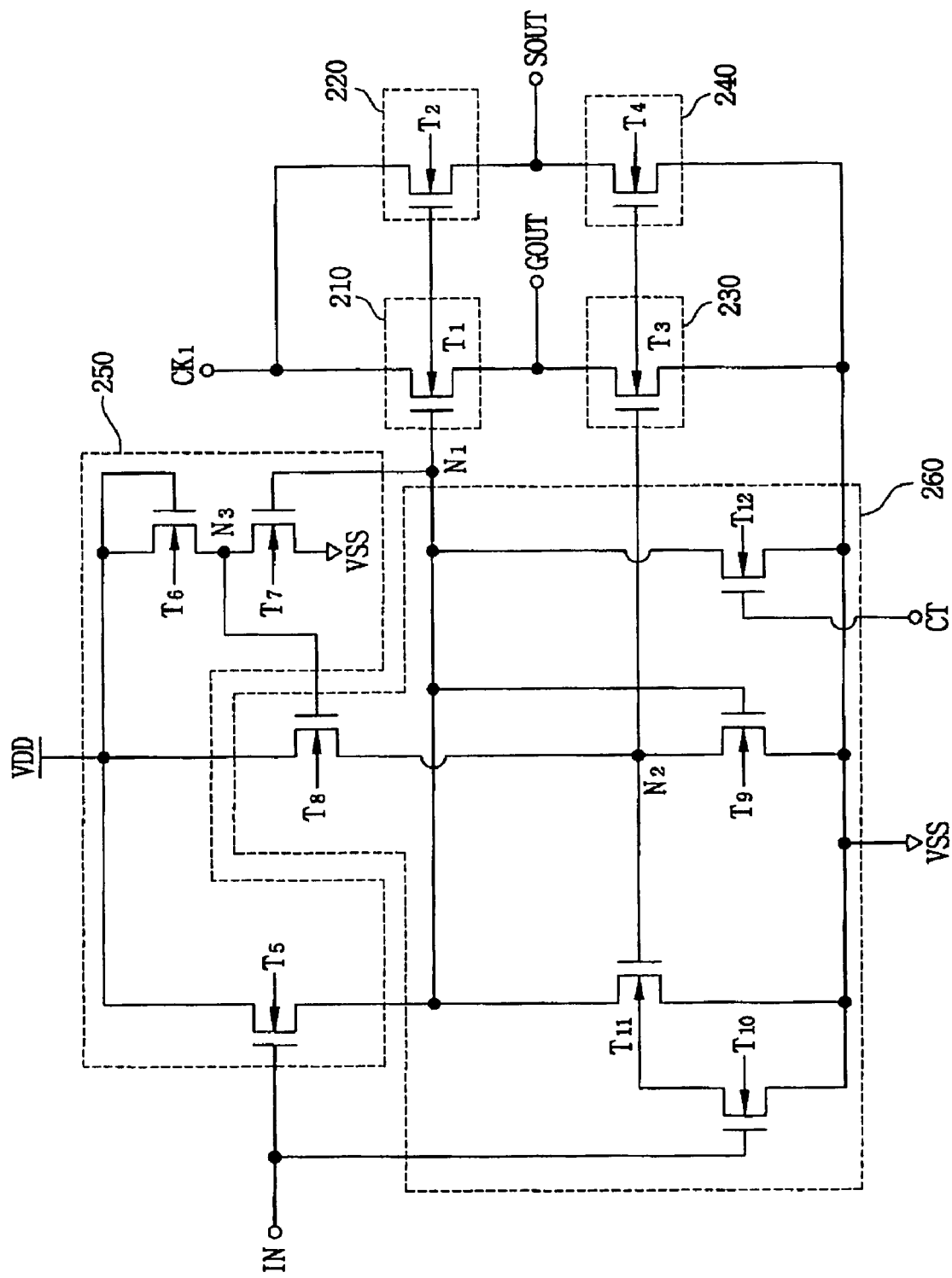
FIG. 5 is a circuit diagram showing a stage of FIG. 3.

FIG. 5 is a circuit diagram showing a stage of FIG. 3. Since the second shift register has a similar circuit structure as that of the first shift register, hereinafter, the first shift register is described and the second shifter register is not described.

Referring to FIGS. 3 and 5, each of the stages includes a first pull-up circuit 210, a second pull-up circuit 220, a first pull-down circuit 230, a second pull-down circuit 240, a pull-up driving circuit 250 and a pull-down driving circuit 260.

The first pull-up circuit 210 provides the first or the second clock signals (CKO, CKBO) to the first output terminal (GOUT) as a gate driving signal. The second pull-up circuit 220 provides the first or the second clock signals (CKO, CKBO) to the second output terminal (SOUT) as a stage driving signal.

The first pull-up circuit 210 includes a first NMOS transistor T1. A gate electrode of the transistor T1 is connected to a first node N1, a source electrode of the transistor T1 is connected to the first clock terminal CK1, and a drain electrode of the transistor T1 is connected to the first output terminal (GOUT).

The second pull-up circuit 220 includes a second NMOS transistor T2. A gate electrode of the transistor T2 is connected to the first node N1, a source electrode of the transistor T2 is connected to the first clock terminal CK1, and a drain electrode of the transistor T2 is connected to the second output terminal (SOUT).

For example, when the channel lengths of the first and second NMOS transistors T1 and T2 are fixed to about 3.5 um, the channel width of the first NMOS transistor T1 is about 1110 um and the channel width of the second NMOS transistor T2 is smaller than the channel width of the first NMOS transistor T1 by about 1/10, that is, about 100 um.

The first pull-down circuit 230 is turned on after the first pull-up circuit 210 is turned off, discharges the first or the second clock signals CKO and CKBO output from the first output terminal (GOUT). The second pull-down circuit 240 is turned on after the second pull-up circuit 220 is turned off, discharges the first or the second clock signals CKO and CKBO output from the second output terminal (SOUT).

The first pull-down circuit 230 includes a third NMOS transistor T3. A gate electrode of the transistor T3 is connected to a second node N2, a drain electrode of the transistor T3 is connected to the first output terminal (GOUT), and a source electrode of the transistor T3 is connected to the second power terminal (VSS).

The second pull-down circuit 240 includes a fourth NMOS transistor T4. A gate electrode of the transistor T4 is connected to the second node N2, a drain electrode of the transistor T4 is connected to the second output terminal (SOUT), and a source electrode of the transistor T4 is connected to the second power terminal (VSS).

For example, when the channel lengths of the third and fourth NMOS transistors T3 and T4 are fixed to about 3.5 um, the channel width of the third NMOS transistor T3 is about 2035 um and the channel width of the fourth NMOS transistor T4 is smaller than the channel width of the third NMOS transistor T3 by about 1/20, that is, about 100 um.

The pull-up driver 250 includes fifth, sixth and seventh NMOS transistors T5, T6 and T7, and controls the turn-on of the first and second pull-up circuits 210 and 220.

A gate electrode of the transistor T5 is connected to the input terminal IN, a drain electrode of the transistor T5 is connected to the first power terminal VDD, and a source electrode of the transistor T5 is connected to the first node N1. A gate electrode and a drain electrode of the transistor T6 are connected to the first power terminal VDD, and a source electrode of the transistor T6 is connected to the third node N3. A gate electrode of the transistor T7 is connected to the first node N1, a drain electrode of the transistor T7 is connected to the third node N3, and a source electrode of the transistor T7 is connected to the second power terminal VSS.

For example, when the channel lengths of the fifth, sixth and seventh NMOS transistors T5, T6 and T7 are fixed to about 3.5 um, the channel width of the fifth NMOS transistor T5 is about 300 um and the channel widths of the sixth and seventh NMOS transistors T6 and T7 are about 50 um.

The pull-down driver 260 includes eighth, ninth, tenth, eleventh and twelfth NMOS transistors T8, T9, T10, T11 and T12. The pull-down driver 260 turns off the first and second pull-up circuit 210 and 220, and controls the turn-on of the first and second pull-down circuits 230 and 240.

A gate electrode of the transistor T8 is connected to the third node N3, a drain electrode of the transistor T8 is connected to the first power terminal VDD, and a source electrode of the transistor T8 is connected to the second node N2. A gate electrode of the transistor T9 is connected to the first node N1, a drain electrode of the transistor T9 is connected to the second node N2, and a source electrode of the transistor T9 is connected to the second power terminal VSS. A gate electrode of the transistor T10 is connected to the input terminal IN, a drain electrode of the transistor T10 is connected to the second node N2, and a source electrode of the transistor T10 is connected to the second power terminal VSS.

A gate electrode of the transistor T11 is connected to the second node N2, a drain electrode of the transistor T11 is connected to the first node N1, and a source electrode of the transistor T11 is connected to the second power terminal VSS. A gate electrode of the transistor T12 is connected to the control terminal CT, a drain electrode of the transistor T12 is connected to the first node N1, and a source electrode of the transistor T12 is connected to the second power terminal VSS.

For example, when the channel lengths of the eighth, ninth, tenth, eleventh and twelfth NMOS transistors T8, T9, T10, T11 and T12 are about 3.5 um, the channel width of the eight and tenth NMOS transistors T8 and T10 are about 100 um, the channel width of the ninth NMOS transistor T9 is about 150 um, the channel width of the eleventh NMOS transistor T11 is about 100 um, and the channel width of the twelfth NMOS transistor T12 is about 150 um.

When the first stage driving signal output from the second output terminal (SOUT) of a previous stage is provided to the input terminal (IN), a fifth transistor T5 is turned on and an electric potential of a first node N1 gradually increases. According as the electric potential of a first node N1 increases, the first and second NMOS transistors T1 and T2 are turned on, and the first gate driving signal and the first stage driving signal are output to the first and second output terminals (GOUT, SOUT), respectively.

While a sixth NMOS transistor T6 is always turned on, an electric potential of a third node N3 decreases when a seventh NMOS transistor T7 is turned on according as the electric potential of the first node N1 increases.

An eighth NMOS transistor T8 maintains a turn-off status because the electric potential of the third node N3 decreases. Thus, the first power voltage VDD does not provided to a second node N2. A ninth NMOS transistor T9 is turned on when the electric potential of the first node N1 increases, and maintains the electric potential of the second node N2 as the ground potential so that third and fourth NMOS transistors T3 and T4 are turned off.

Afterwards, when the first stage driving signal output from the second output terminal (SOUT) of a next stage is provided to the control terminal (CT), a twelfth transistor T12 is turned on and the electric potential of the first node N1 decreases to the ground. Seventh and ninth NMOS transistors T7 and T9 are turned off according as the electric potential of the first node N1 decreases.

Thus, the electric potential of the second node N2 increases, the third and fourth NMOS transistors T3 and T4 are turned on, the first gate driving signal output from the first and second output terminals (GOUT, SOUT) is discharged to the ground VSS.

The tenth and eleventh NMOS transistors T10 and T11 are turned on according as the electric potential of the second node N2 increases, and the electric potential of the first node N1 rapidly decreases. By repeating above operations, each of the stages outputs the first gate driving signal and the first stage driving signal that maintain a high level for a predetermined time period.

Figure 6:
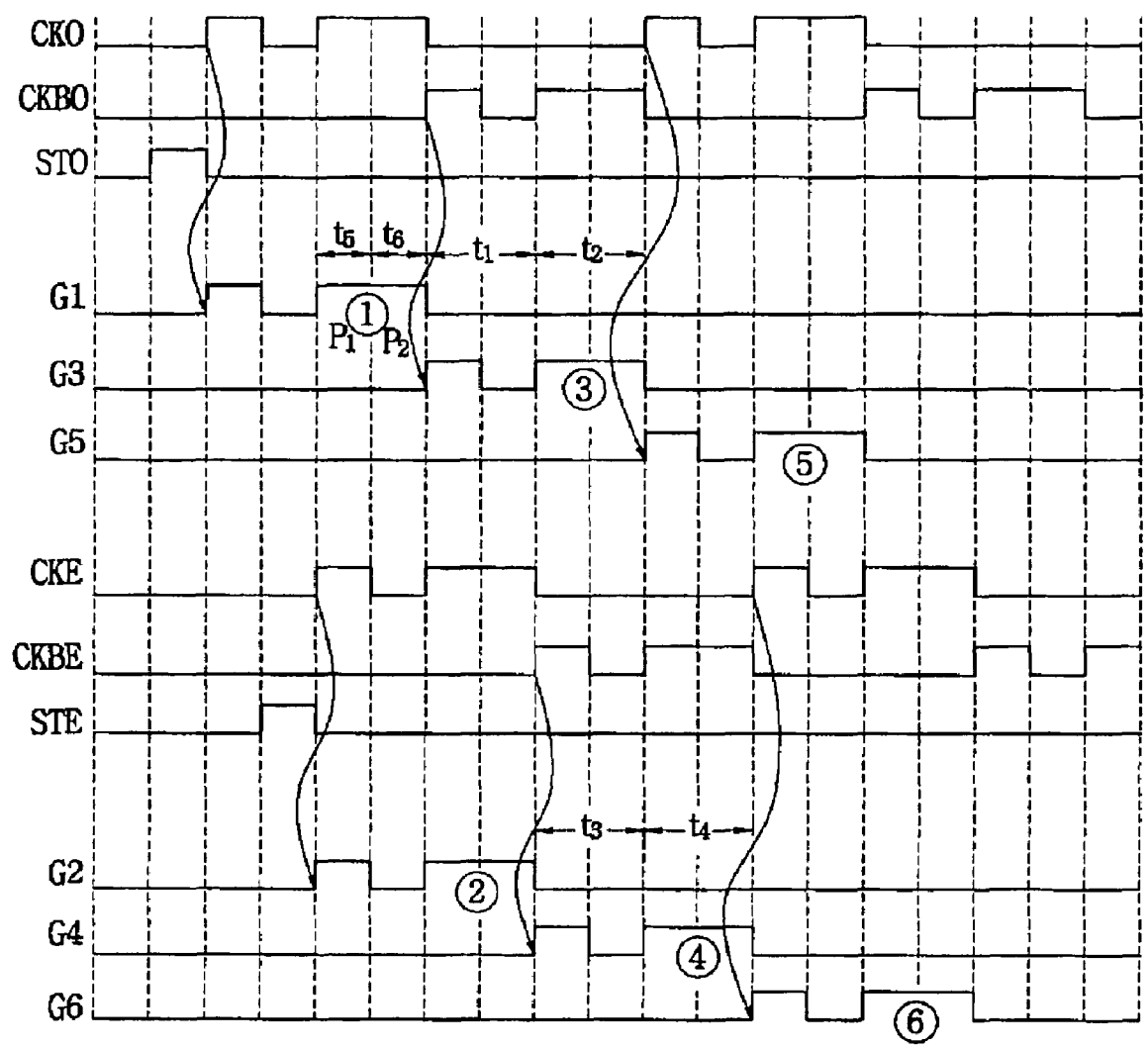
FIG. 6 is a timing diagram showing gate driving signals output from the first and second gate drivers of FIG. 3.

FIG. 6 is a timing diagram showing gate driving signals output from the first and second gate drivers of FIG. 3.

Referring to FIGS. 2, 3, 4, 5 and 6, when the first start signal STO is applied to the input terminal IN of the first stage SRCO1 of the first gate driver 200, the first or second clock signals (CKO or CKBO), the first power voltage VDD and the second power voltage VSS are applied to each of the stages SRCO1, SRCO2, SRCO3, SRCO4, . . . .

Thus, after the first start signal STO is provided to the input terminal IN, the first stage SRCO1 is turned on, the first clock signal CKO is output from the first and second output terminals (GOUT, SOUT) of the first stage SRCO1. The first clock signal CKO is applied to the first gate line G1 as the first gate driving signal.

After the first stage SRCO1 is turned off, the second stage SRCO2 is turned on, the second clock signal CKBO is output from the first and second output terminals (GOUT, SOUT) of the second stage SRCO2. The second clock signal CKBO is applied to the third gate line G3 as the first gate driving signal.

After the second stage SRCO2 is turned off, the third stage SRCO3 is turned on, the first clock signal CKO is output from the first and second output terminals (GOUT, SOUT) of the third stage SRCO3. The first clock signal CKO is applied to the fifth gate line G5 as the first gate driving signal.

Thus, the first gate driver 200 sequentially output the first gate driving signals to the odd numbered gate lines G1, G3, G5, . . .

When the second start signal STE is applied to the input terminal IN of the first stage SRCE1 of the second gate driver 300, the third or fourth clock signals (CKE or CKBE), the first power voltage VDD and the second power voltage VSS are applied to each of the stages SRCE1, SRCE2, SRCE3, SRCE4, . . .

Thus, after the second start signal STE is provided to the input terminal IN, the first stage SRCE1 is turned on, the third clock signal CKE is output from the first and second output terminals (GOUT, SOUT) of the first stage SRCE1. The third clock signal CKE is applied to the second gate line G2 as the second gate driving signal.

After the first stage SRCE1 is turned off, the second stage SRCE2 is turned on, the fourth clock signal CKBE is output from the first and second output terminals (GOUT, SOUT) of the second stage SRCE2. The fourth clock signal CKBE is applied to the fourth gate line G4 as the second gate driving signal.

After the second stage SRCE2 is turned off, the third stage SRCE3 is turned on, the third clock signal CKE is output from the first and second output terminals (GOUT, SOUT) of the third stage SRCE3. The third clock signal CKE is applied to the sixth gate line G6 as the second gate driving signal.

Thus, the second gate driver 300 sequentially output the second gate driving signals to the even numbered gate lines G2, G4, G6, . . .

The third clock signal CKE is delayed by ¼ period with respect to the first clock signal CKO, and the fourth clock signal CKBE is delayed by ¼ period with respect to the second clock signal CKBO. Thus, the first gate driving signals that are applied to the odd numbered gate lines G1, G3, G5, . . . are respectively delayed by ¼ period with respect to the second gate driving signals that are applied to the even numbered gate lines G2, G4, G6, . . . Particularly, the second gate driving signal that is applied to the second gate line G2 is delayed by ¼ period with respect to the first gate driving signal that is applied to the first gate line G1.

The first pixel P1 includes the first TFT (Tr1) connected to the first gate line G1, the second TFT (Tr2) connected to the second gate line G2, the first data line D1, and the first pixel electrode (PE1) connected to the first TFT (Tr1). When the first and second TFTs (Tr1, Tr2) are turned on, the image signal output from the first data line D1 may be applied to the first pixel electrode PE1. The first and second TFTs (Tr1, Tr2) are turned on when the first gate driving signal that is applied to the first gate line G1 and the second gate driving signal that is applied to the second gate line G2 have a high level, respectively.

The first gate driving signal has a first time period (t1) and a second time period (t2). The second TFT (Tr2) of a previous stage that is connected to the odd numbered gate line G1, G3, G5, . . . is driven during the first time period (t1). The first TFT (Tr1) of a present stage that is connected to the odd numbered gate line G1, G3, G5, . . . is driven during the second time period (t2).

The second gate driving signal has a third time period (t3) and a fourth time period (t4). The second TFT (Tr2) of a previous stage that is connected to the second gate line G2 is driven during the third time period (t3). The first TFT (Tr1) of a present stage that is connected to the second gate line G2 is driven during the fourth time period (t4).

As shown in FIG. 6, the second time period (t2) of the first gate driving signal overlaps with the third time period (t3) of the second gate driving signal.

As described above, the first gate driving signal turns on the first TFT (Tr1) during the second time period (t2), and the second gate driving signal turns on the second TFT (Tr2) during the third time period (t3). Thus, the image signal output from the first data line D1 passes through the first and second TFTs Tr1 and Tr2, and then applied to the first pixel electrode PE1.

The second time period includes a fifth time period (t5) and a sixth time period (t6). The first data line D1 outputs the image signal to the first pixel electrode PE1 of the first pixel P1 during the fifth period (t5). The first data line D1 outputs the image signal to the second pixel electrode PE2 of the second pixel P2 during the sixth period (t6). Namely, the first TFT (Tr1) is turned on during the fifth time period (t5), however, the first TFT (Tr1) is turned off by the second gate driving signal during the sixth time period (t6). Thus, the image signal is not provided to the first pixel electrode PE1 during the sixth time period (t6), and the image signal passes through the third and fourth TFTs (Tr3, Tr4) to be provided to the second pixel electrode PE2 during the sixth time period (t6).

Even though the first and second pixels P1 and P2 are commonly connected to the first data line D1, the first data line D1 is able to output the image signal to the first and second pixel electrode PE1 and PE2, respectively, during a given time period.

Thus, the pixel regions connected to the odd numbered gate lines G1, G3, and G5, . . . and the pixel regions connected to the even numbered gate lines G2, G4, and G65, . . . may be alternately driven.

Figure 7:
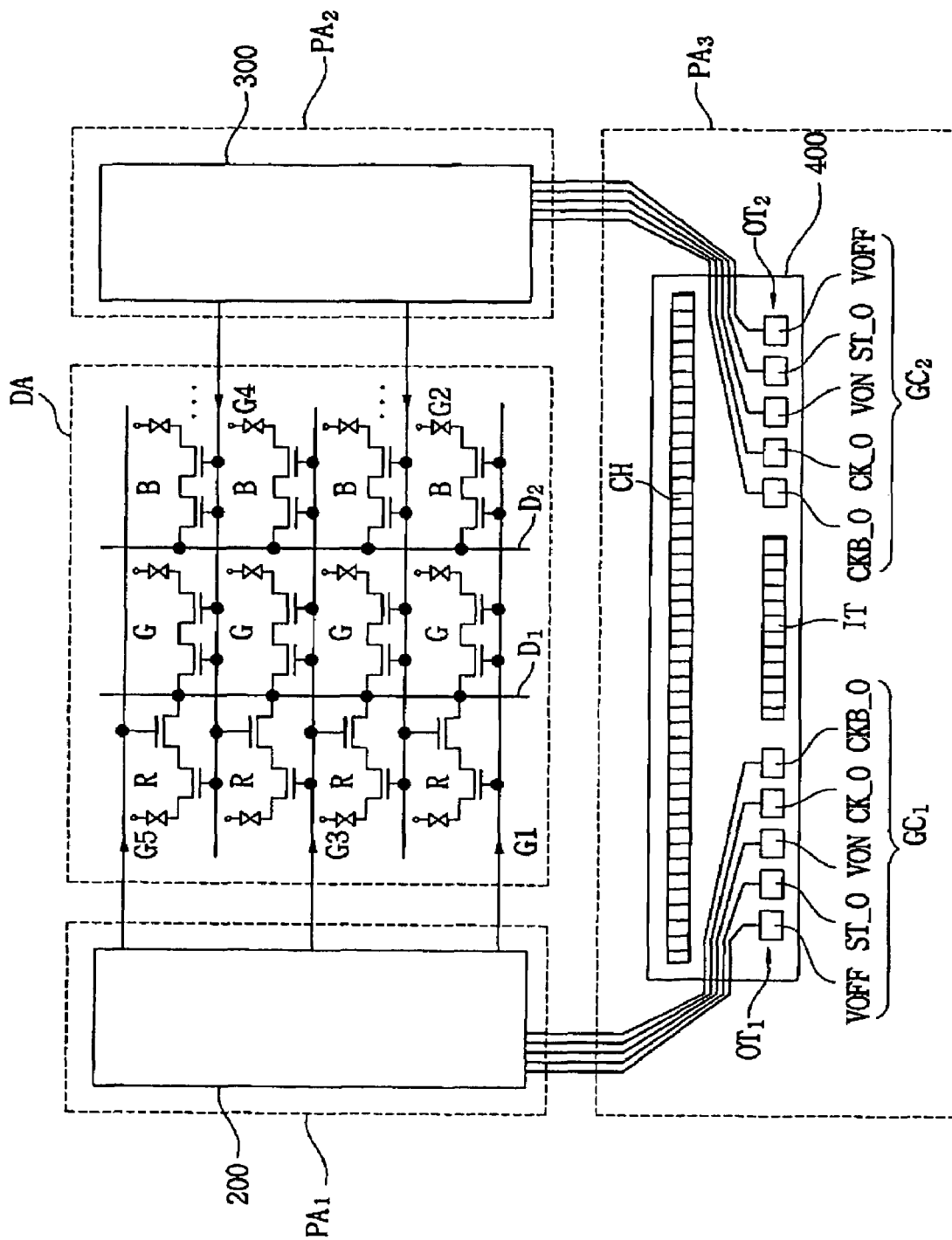
FIG. 7 is a schematic diagram showing the first and second gate drivers and an integrated chip.
Figure 8:
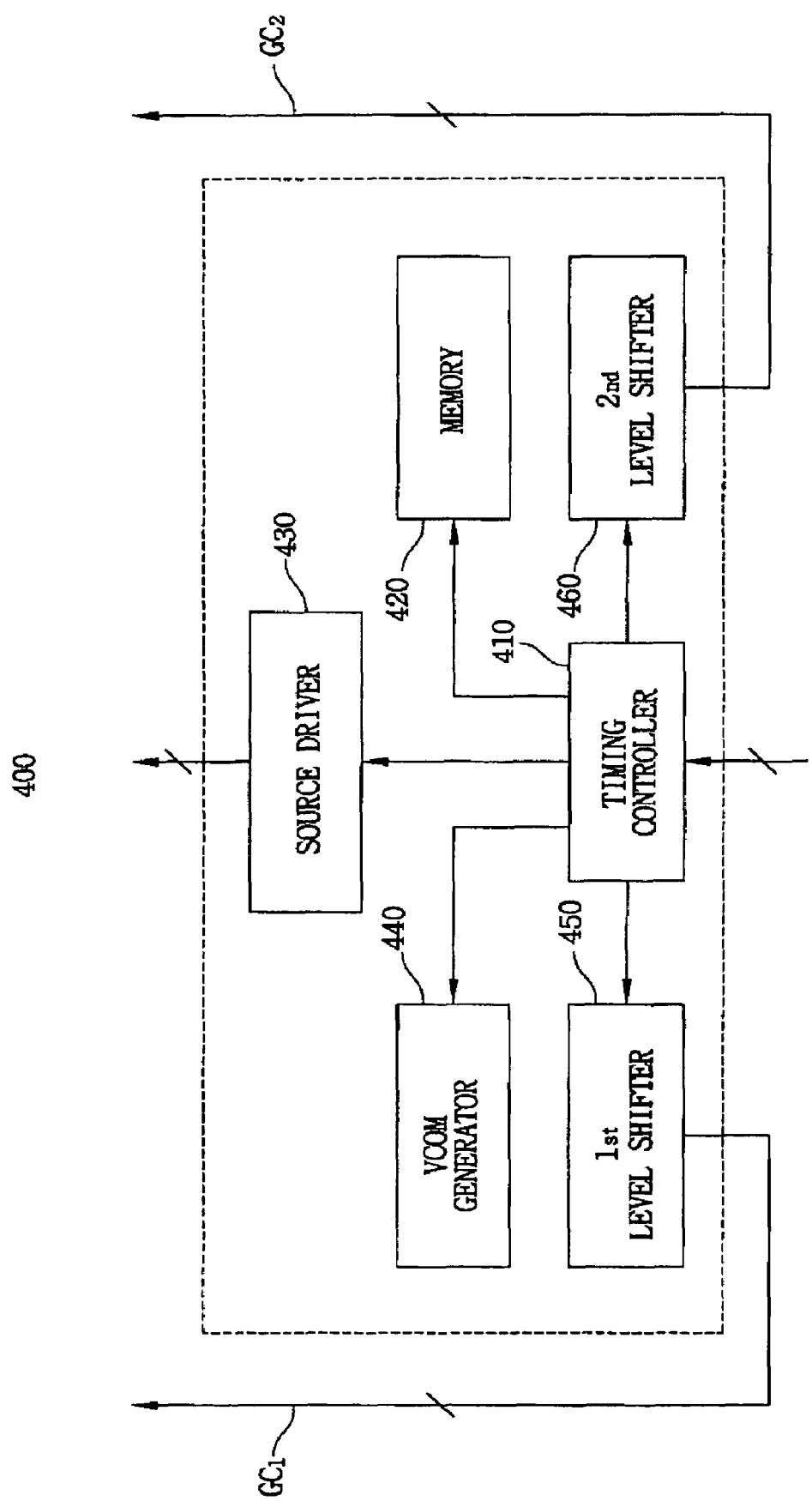
FIG. 8 is a block diagram showing the integrated chip of FIG. 7.

FIG. 7 is a schematic diagram showing the first and second gate drivers and an integrated chip, and FIG. 8 is a block diagram showing the integrated chip of FIG. 7.

Referring to FIG. 7, the display region (DA) includes a plurality of pixel regions. The first gate driver 200 is formed in the first peripheral region (PA1) and the second gate driver 300 is formed in the second peripheral region (PA2). The integrated chip 400 is mounted on the third peripheral region (PA3).

The integrated chip 400 includes an input terminal (IT), channels (CH), a first output terminal (OT1) and a second output terminal (OT2). The input terminal (IT) receives external signals from external devices. The image signal is output to the data lines in the display region (DA) via the channels (CH). The first control signal GC1 is output to the first gate driver 200 via the first output terminal (OT1), and the second control signal GC2 is output to the second gate driver 300 via the second output terminal (OT2).

As shown in FIGS. 7 and 8, the integrated chip 400 includes a timing controller 410, a memory 420, a source driver 430, a common voltage (Vcom) generator 440, first and second level shifters 450 and 460.

The external signals are provided to the timing controller 410 via the input terminal (IT). The timing controller 410 receives the external signals such as an external image signal and an external control signal, stores the external image signal in the memory 420. The external control signal may include a horizontal synchronization signal, a vertical synchronization signal, a main clock signal, a data enable signal and a mode selection signal.

The timing controller 410 provides the first control signal GC1 to the first level shifter 450, and provides the second control signal GC2 to the second level shifter 460. The first control signal GC1 includes the first start signal STO, the first clock signal CKO, the second clock signal CKBO, the first power voltage VDD and the second power voltage VSS. The second control signal GC2 includes the second start signal STE, the third clock signal CKE, the fourth clock signal CKBE, the first power voltage VDD and the second power voltage VSS.

The timing controller 410 extracts a block of the external image signals from the memory 420 and provides the block of the image signal to the source driver 430.

The memory 420 temporally stores the external image signals supplied from the timing controller 410. The memory 420 stores the external image signals in a unit of a frame or in a unit of a line.

The source driver 430 converts the block of external image signals read from the memory 420 into analog image signals and outputs the analog image signals in a unit of blocks. The channels (CH) of the source driver 430 are connected to a plurality of data lines, and provide the analog image signals to the data lines.

The first level shifter 450 shifts a voltage level of the first control signal GC1 supplied from the timing controller 410. The second level shifter 460 shifts a voltage level of the second control signal GC2 supplied from the timing controller 410.

Thus, the first level shifter 450 outputs level-shifted first start signal (STO), level-shifted first clock signal CKO, level-shifted second clock signal CKBO, the first and second power voltage VDD and VSS. The second level shifter 460 outputs level-shifted second start signal (STE), level-shifted third clock signal CKE, level-shifted fourth clock signal CKBE, the first and second power voltage VDD and VSS.

The first gate driver 200 sequentially provides the first gate driving signals to the odd numbered gate lines G1, G3, G5, . . . in response to the level-shifted first control signal GC1. The second gate driver 300 sequentially provides the second gate driving signals to the even numbered gate lines G2, G4, G6, . . . in response to the level-shifted second control signal GC2.

The Vcom generator 440 applies a common voltage (Vcom) to a common electrode line (not shown) that faces a liquid crystal layer.

According to the display device of the present invention, the display panel includes a plurality of pixel regions, and each of the pixel regions includes first, second and third pixels corresponding respectively to R, G and B color filters.

In addition, the first and second pixels are commonly connected to a data line. The data line divides the time period, during which the gate driving signal is applied to a gate line connected to the first and second pixels, into two time periods. Thus, the data line may sequentially output the image signal to the first and second pixels, and the number of the data lines may be reduced.

While the exemplary embodiments of the present invention and their advantages have been described in detail, it should be understood that various changes, substitutions and alterations may be made herein without departing from the scope of the invention.

What is claimed is:

1. A display device comprising:
   a display panel including a plurality of pixel regions respectively having first, second and third pixels, the first pixel coupled to a first gate line, a second gate line and a first data line, the second gate line being adjacent to the first gate line, the second pixel coupled to the first gate line and the first data line, the third pixel coupled to the first gate line and a second data line adjacent to the first data line;
   a first gate driver configured to provide the first gate line with a first gate driving signal;
   a second gate driver configured to provide the second gate line with a second gate driving signal; and
   a data driver configured to provide the first and second data lines with an image signal,
   wherein the first and second pixels are driven by the first data line and the third pixel is only driven by the second data line; and
   wherein the second data line is between the second pixel and the third pixel.

2. The display device of claim 1, wherein the first pixel includes:
   a first pixel electrode;
   a first transistor having a control electrode coupled to the second gate line, a first current electrode coupled to the first data line, and a second current electrode; and
   a second transistor having a control electrode coupled to the first gate line, a first current electrode coupled to the second current electrode of the first transistor, and a second current electrode coupled to the first pixel electrode.

3. The display device of claim 2, wherein the first gate driving signal having a first time period and a second time period, the first and second pixels of previous stage coupled to the first gate line being driven by the first gate driving signal during the first time period, the first, second and third pixels of present stage coupled to the first gate line being driven by the first gate driving signal during the second time period.

and wherein the second gate driving signal having a third time period and a fourth time period, the first and second pixels of previous stage coupled to the second gate line being driven by the second gate driving signal during the third time period, the first, second and third pixels of present stage coupled to the second gate line being driven by the second gate driving signal during the fourth time period.

4. The display device of claim 2, wherein the second pixel includes:
a second pixel electrode;
a third transistor having a control electrode coupled to the first gate line, a first current electrode coupled to the first data line, and a second current electrode; and
a fourth transistor having a control electrode coupled to the first gate line, a first current electrode coupled to the second current electrode of the third transistor, and a second current electrode coupled to the second pixel electrode.

5. The display device of claim 4, wherein the first and third time periods respectively includes a fifth time period and a sixth time period, the first transistor is turned on during the fifth time period and the image signal is provided to the first pixel electrode during the fifth time period, the first transistor is turned off during the sixth time period and the image signal is provided to the second pixel electrode during the sixth time period.

6. The display device of claim 2, wherein the third pixel includes:
a third pixel electrode;
a fifth transistor having a control electrode coupled to the first gate line, a first current electrode coupled to the second data line, and a second current electrode; and a sixth transistor having a control electrode coupled to the first gate line, a first current electrode coupled to the second current electrode of the fifth transistor, and a second current electrode coupled to the third pixel electrode.

7. The display device of claim 2. wherein the display panel further includes a R (red) color filter, a G (green) color filter and a B (blue) color filter respectively corresponding to the first, second and third pixels.

8. The display device of claim 1, wherein the first gate driver includes a shift register having a plurality of stages which is cascade-connected each other, each of the stage includes a first clock terminal for receiving a first clock signal, a first output terminal for outputting the first clock signal as the first gate driving signal, a second output terminal for outputting the first clock signal as a first stage driving signal, an input terminal for receiving the first stage driving signal output from a second output terminal of a previous stage, and a control terminal for receiving the first stage driving signal output from a second output terminal of a next stage.

9. The display device of claim 1, wherein the second gate driver includes a shift register having a plurality of stages which is cascade-connected each other, each of the stages includes a first clock terminal for receiving a second clock signal, a first output terminal for outputting the second clock signal as the first gate driving signal, a second output terminal for outputting the first clock signal as a first stage driving signal, an input terminal for receiving the first stage driving signal output from a second output terminal of a previous stage, and a control terminal for receiving the first stage driving signal output from a second output terminal of a next stage.

10. The display device of claim 1, wherein the display panel includes a display region, a first peripheral region, a second peripheral region and a third peripheral region, the first, second and third peripheral regions are disposed peripheral to the display region, and wherein the first gate driver is integrated in the first peripheral region, and the second gate driver is integrated in the second peripheral region.

* * * * *